(12) United States Patent  (10) Patent No.: US 9,361,963 B2
Manzke et al.  (45) Date of Patent: Jun. 7, 2016

(54) SPINTRONIC CIRCUIT AND METHOD OF OPERATION THEREFORE

(71) Applicant: Forschungsverbund Berlin e.V., Berlin (DE)

(72) Inventors: Yori Manzke, Berlin (DE); Rouin Farshchi, San Jose, CA (US); Manfred Ramsteiner, Berlin (DE)

(73) Assignee: Forschungsverbund Berlin e.V., Berlin (DE)

(*) Notice: Subject to any disclaimer, the term of this patent is extended or adjusted under 35 U.S.C. 154(b) by 0 days.

(21) Appl. No.: 14/415,048

(22) PCT Filed: Jul. 3, 2013

(86) PCT No.: PCT/EP2013/001944
§ 371 (c)(1),
(2) Date: Jan. 15, 2015

(87) PCT Pub. No.: WO2014/012624
PCT Pub. Date: Jan. 23, 2014

(65) Prior Publication Data
US 2015/0221357 A1 Aug. 6, 2015

(30) Foreign Application Priority Data
Jul. 19, 2012 (EP) .................................. 12005292

(51) Int. Cl.
G11C 11/16 (2006.01)
G11C 11/15 (2006.01)
(Continued)

(52) U.S. Cl.
CPC .............. *G11C 11/161* (2013.01); *G11C 11/14* (2013.01); *G11C 11/16* (2013.01);
(Continued)

(58) Field of Classification Search
CPC ........... G11C 11/1675; G11C 11/1673; G11C 11/161; G11C 11/1659; G11C 11/16
USPC ......................................................... 365/158
See application file for complete search history.

(56) References Cited

U.S. PATENT DOCUMENTS 6,956,269 B1 * 10/2005 Vashchenko ...... H01L 29/66984
257/252
6,963,091 B1 * 11/2005 Vashchenko .......... H01L 29/456
257/213

(Continued)

FOREIGN PATENT DOCUMENTS

FR 2871279 A1 12/2005
WO 2006000696 A1 1/2006

OTHER PUBLICATIONS

Katti, "Current-in-plane pseudo-spin-valve device performance for giant magnetoresistive random access memory applications (invited)", Journal of Applied Physics, vol. 91, No. 10, pp. 7245-7250 (2002).

(Continued)

*Primary Examiner* — Ly D Pham
(74) *Attorney, Agent, or Firm* — Caeser Rivise, PC

(57) ABSTRACT

The invention relates to a spintronic circuit (10; 11; 15) comprising: a conductive non-magnetic channel (1); —means (2, NM, FM1-FM3) for generating spin polarized electrons (4) in the non-magnetic channel (1) by spin extraction; at least two ferromagnetic contacts (FM1-FM3) arranged along the non-magnetic channel (1) one after another, —means (7, 8, 9) for adjusting the magnetization direction of the ferromagnetic contacts (FM1-FM3); means for propagating the spin polarized electrons (4) along the non-magnetic channel (1); means (5, 6) for measuring the contact resistance of the individual ferromagnetic contacts (FM1-FM3), wherein the contact resistance depends on the relative alignment of the spin polarization direction of the spin polarized electrons (4) in the non-magnetic channel (1) at the ferromagnetic contact (FM1-FM3) and the magnetization direction of the ferromagnetic contact (FM1-FM3).

21 Claims, 6 Drawing Sheets

(51) Int. Cl.
*G11C 5/02* (2006.01)
*G11C 5/06* (2006.01)
*G11C 11/14* (2006.01)
*G11C 11/56* (2006.01)
*H01L 43/08* (2006.01)
*G11C 29/50* (2006.01)
*G11C 19/08* (2006.01)

(52) U.S. Cl.
CPC ....... *G11C 11/1673* (2013.01); *G11C 11/1675* (2013.01); *G11C 11/5607* (2013.01); *G11C 19/0808* (2013.01); *G11C 29/50008* (2013.01); *H01L 43/08* (2013.01); *G11C 11/1659* (2013.01)

(56) References Cited

U.S. PATENT DOCUMENTS

| | | | | |
|---|---|---|---|---|
| 7,274,080 | B1* | 9/2007 | Parkin | H01L 29/66984 257/30 |
| 2005/0047204 | A1* | 3/2005 | Johnson | G01R 33/06 365/158 |
| 2005/0088787 | A1* | 4/2005 | Takahashi | B82Y 10/00 360/324.2 |
| 2005/0219767 | A1* | 10/2005 | Nakamura | H01L 43/08 360/324.1 |
| 2007/0253116 | A1* | 11/2007 | Takahashi | B82Y 25/00 360/313 |
| 2008/0017843 | A1* | 1/2008 | Kaushal | H01F 10/16 257/14 |
| 2009/0008689 | A1* | 1/2009 | Koo | H01L 29/7787 257/295 |
| 2009/0067224 | A1* | 3/2009 | Hochstrat | G11C 11/16 365/158 |
| 2010/0072993 | A1* | 3/2010 | Pan | B82Y 25/00 324/301 |
| 2011/0042720 | A1* | 2/2011 | Jalil | H01L 29/66984 257/194 |
| 2015/0200003 | A1* | 7/2015 | Buhrman | G11C 11/18 365/158 |

OTHER PUBLICATIONS

Ralph et al., "Current Perspectives—Spin transfer torques", Journal of Magnetism and Magnetic Materials, vol. 320, pp. 1190-1216 (2008).

Stephens et al., "Spin accumulation in forward-biased MnAs/GaAs Schottky diodes", Phys. Rev. Lett., vol. 93, 097602 (2004).

International Preliminary Report on Patentability for PCT/EP2013/001944 dated Jan. 20, 2015.

International Search Report for PCT/EP2013/001944 dated Nov. 7, 2013.

* cited by examiner

| In: FM1 | In: FM2 | Pr.: FM3 | Out | | In: FM1 | In: FM2 | Pr.: FM3 | Out | |
|---|---|---|---|---|---|---|---|---|---|
| ↓ | ↓ | ↑ | T | } NOR | ↑ | ↑ | ↓ | T | } AND |
| ↑ | ↑ | ↑ | F | | ↓ | ↓ | ↓ | F | |
| ↑ | ↓ | ↑ | F | | ↓ | ↑ | ↓ | F | |
| ↓ | ↑ | ↑ | F | | ↑ | ↓ | ↓ | F | |

SPINTRONIC CIRCUIT AND METHOD OF OPERATION THEREFORE

FIELD OF THE INVENTION

The invention relates to a spintronic circuit, particularly in the form of a memory circuit or a logic circuit. Further, the invention relates to a method of operation for such a spintronic circuit.

BACKGROUND OF THE INVENTION

Spintronics is a portmanteau meaning "spin-based electronics" and refers to a technology using the spin of electrons in addition to their charge.

One example of a conventional spintronic circuit is the so-called magnetoresistive random-access memory (MRAM) which is a non-volatile random-access memory which uses the so-called giant magnetoresistive effect (GMR).

Another example of a conventional spintronic circuit is a sensor using the afore-mentioned giant magnetoresistive effect, wherein these sensors can be used, for example, in hard disk drives for data read-out. Such a GMR spin-valve comprises a non-magnetic channel and two ferromagnetic contacts arranged on opposing sides of the non-magnetic channel. If an electron passes through such a spin-valve, the electron will be scattered, wherein the amount of scattering depends on the relative alignment of the spin direction of the electron on the one hand and the magnetization direction of the ferromagnetic contacts on the other hand.

Further, reference is made to KATTI R. R.: "Current-in-plane pseudo-spin-valve device performance for giant magnetoresistive random access memory applications", Journal of Applied Physics, 15 May 2002, Volume 91, Number 10, pages 7245-7250, which represents the technological background of the invention.

SUMMARY OF THE INVENTION

In view of the afore-mentioned state of the art, it is a general objective of the invention to provide an improved spintronic circuit and an associated method of operation. Particularly, it is an objective of the invention to provide a spintronic circuit which can be used as a logic circuit or as a memory circuit.

These objectives are achieved by a novel spintronic circuit and a corresponding method of operation as defined in the independent claims.

Firstly, the spintronic circuit according to the invention comprises an electrically conductive, non-magnetic channel. For example, the non-magnetic channel can consist of n-type gallium arsenide, aluminium, or graphene. However, the invention is not restricted to these materials of the substrate forming the non-magnetic channel. Further, it should be noted that the non-magnetic channel is preferably elongated so that electrons can propagate along the non-magnetic channel.

Further, the spintronic circuit according to the invention comprises means for generating spin polarized electrons in the non-magnetic channel.

Moreover, the spintronic circuit according to the invention comprises at least two ferromagnetic contacts arranged on the non-magnetic channel, wherein the ferromagnetic contacts each have an adjustable magnetization direction and a variable contact resistance, which will be described in more detail later.

Further, the spintronic circuit according to the invention comprises means for adjusting the magnetization direction of the ferromagnetic contacts.

In contrast to the afore-mentioned conventional GMR spin-valve, the spintronic circuit according to the invention is characterized in that the ferromagnetic contacts are arranged on the non-magnetic channel along the non-magnetic channel one after another. In this regard, it should be noted that the ferromagnetic contacts are preferably arranged on the same side of the non-magnetic channel in contrast to the afore-mentioned conventional spin-valve GMR, in which the ferromagnetic contacts are arranged on opposite sides of the non-magnetic channel. Further, the ferromagnetic contacts are preferably elongated and aligned perpendicular to the non-magnetic channel.

Further, the spintronic circuit according to the invention is characterized in that the means for generating the spin polarized electrons operate by spin extraction (spin reflection) upon a net electron flow from the non-magnetic channel to one of the ferromagnetic contacts. This so-called spin extraction or spin reflection is illustrated in detail in STEPHENS et al.: "Spin accumulation in forward-biased MnAs/GaAs Schottky diodes", Physical Review Letters 93, 097602 (2004), so that this publication is incorporated by reference herein.

Moreover, the spintronic circuit according to the invention comprises means for propagating the spin polarized electrons by way of drift along the non-magnetic channel caused by an applied electric field. In other words, the spin polarized electrons generated in the conductive non-magnetic channel propagate along the non-magnetic channel due to an electric field. The details of this mechanism will be described in more detail later.

Further, the spintronic circuit according to the invention comprises means for measuring the contact resistance of the individual ferromagnetic contacts, wherein the contact resistance depends on the relative alignment of the spin polarization direction of the spin polarized electrons in the non-magnetic channel at the ferromagnetic contact on the one hand and the magnetization direction of the ferromagnetic contact on the other hand. The variation of the contact resistance of the individual ferromagnetic contacts is caused by the well-known magnetoresistance effect.

The afore-mentioned basic element of a spintronic circuit according to the invention can be used, for example, in a logic circuit or in a memory circuit, which will be described in more detail later.

It has already been mentioned that the spintronic circuit according to the invention comprises means for generating the spin polarized electrons in the non-magnetic channel based on the well-known spin reflection or spin extraction. Additionally, the means for generating the spin polarized electrons in the non-magnetic channel preferably comprise a non-magnetic contact arranged on the non-magnetic channel and a first current source connected to the non-magnetic contact on the non-magnetic channel for injecting the electrons into the non-magnetic channel. In other words, the first current source injects the electrons into the non-magnetic channel via the non-magnetic contact. In this regard, it should be noted that the non-magnetic contact is preferably arranged on the same side of the non-magnetic channel as the ferromagnetic contacts. Further, it should be noted that the non-magnetic contact is preferably arranged at the beginning of the conductive non-magnetic channel so that the injected electrons propagate along the non-magnetic channel thereby passing the ferromagnetic contacts one after another.

Further, it should be noted that the injected electrons are initially unpolarized and then have to be polarized in the non-magnetic channel. It has already been mentioned that the polarization of the electrons is made by spin extraction or spin reflection upon a net electron flow from the non-magnetic channel into one of the ferromagnetic contacts. Therefore, the electrons in the non-magnetic channel are polarized at each ferromagnetic contact based on the magnetization direction of the ferromagnetic contact. As a result of this mechanism, the spin polarization direction of the spin polarized electrons in the non-magnetic channel arriving at each ferromagnetic contact is determined by the spin extraction at the preceding ferromagnetic contacts along the channel. For example, the spin polarization direction of the electrons arriving at the third ferromagnetic contact depends on the spin extraction at the second ferromagnetic contact which is in turn determined by the magnetization direction of the second ferromagnetic contact.

In the preferred embodiment of the invention, the ferromagnetic contacts are connected to the first current source, so that the electron current generated by the first current source flows through the non-magnetic contact into the non-magnetic channel and then splits into partial electron currents flowing through the ferromagnetic contacts back to the first current source, wherein the partial currents depend on the contact resistances of the individual ferromagnetic contacts. In other words, the variable contact resistances of the individual ferromagnetic contacts together form a current divider so that the partial currents flowing through the individual ferromagnetic contacts represent the corresponding contact resistances. Further, the spintronic circuit according to the invention preferably comprises a measuring unit measuring an electric output at one or more of the ferromagnetic contacts, wherein the electric output represents the magnetization directions of the ferromagnetic contacts.

In one embodiment of the invention, the measuring unit directly measures one of the partial currents flowing through one of the ferromagnetic contacts. In this embodiment of the invention, the measuring unit comprises an amperemeter.

In another embodiment of the invention, the measuring unit measures a voltage drop between two of the ferromagnetic contacts, wherein there is a second current source connected in parallel to the measuring unit between the associated ferromagnetic contacts thereby improving the signal-to-noise ratio of the measurement. In this embodiment of the invention, the measuring unit comprises a voltmeter.

It should be noted that the magnetization directions of the individual ferromagnetic contacts are adjustable, so that the number of possible magnetization configurations of the entire spintronic circuit depends on the number of ferromagnetic contacts. In other words, the magnetization configuration of the entire spintronic circuit is defined by the magnetization directions of all ferromagnetic contacts of the spintronic circuit. Further, it should be noted that the electric output measured by the measuring unit is preferably a multi-level output comprising several possible output levels (e.g. voltage levels). In the preferred embodiment of the invention, each magnetization configuration of the entire spintronic circuit is associated with one of the output levels of the multi-level output, so that a single measurement by the measuring unit represents the complete magnetization configuration of the entire spintronic circuit. More precisely, if there are m ferromagnetic contacts each allowing an "up direction" and a "down direction" of the magnetization direction, there are $2^m$ possible magnetization configurations, which result in $2^{m-1}$ non-degenerate output levels due to symmetry.

It has already been mentioned that the spintronic circuit according to the invention comprises means for adjusting the magnetization direction of the individual ferromagnetic contacts. In this regard, it should be noted that it is preferably possible to adjust the magnetization direction of the individual ferromagnetic contacts independently from each other.

In one embodiment of the invention, the means for adjusting the magnetization direction of the ferromagnetic contacts comprise a current carrying conductor generating a stray field for adjusting the magnetization direction of the associated ferromagnetic contact.

In another embodiment of the invention, the means for adjusting the magnetization direction of the ferromagnetic contacts comprise a so-called spin-transfer torque mechanism (STT). The details of such a spin-transfer torque mechanism are illustrated, for example in RALPH/STILES: "Spin transfer torques", Journal of Magnetism and Magnetic Materials 302 (2008), 1190-1216, so that this paper is incorporated by reference herein.

It has already been mentioned that the spin direction of the spin polarized electrons in the non-magnetic channel preferably depends on the spin extraction at the preceding ferromagnetic contact. However, it is essential for the invention that the ferromagnetic contacts are so close to each other that the spin polarization of the spin polarized electrons does not substantially decay during propagation from one of the ferromagnetic contacts to the next ferromagnetic contact. In this regard, it should be noted, that the non-magnetic channel has a characteristic spin diffusion length, so that the spin polarization of the spin polarized electrons substantially decays after diffusion over the spin diffusion length along the non-magnetic channel. It should be noted that the separation, i.e. the distance, between the adjacent ferromagnetic contacts on the non-magnetic channel is preferably smaller than the spin diffusion length, so that the electron spin polarization does not substantially decay during propagation from one of the ferromagnetic contacts to the next one of the ferromagnetic contacts.

Further, it has already been mentioned that a single measurement of the multi-level output of the spintronic circuit preferably represents the magnetization configuration of the entire spintronic circuit. Therefore, it is desirable to have a unique relationship between the magnetization configuration on the one hand and the resulting multi-level output on the other hand. However, it should be noted that there are symmetric equivalents of the magnetization configurations so that two symmetric magnetization configurations of the spintronic circuit may result in the same multi-level output, which is undesirable. To obtain a unique output for a given magnetization configuration of the spintronic circuit, it is suggested to fix the magnetization direction of at least one of the ferromagnetic contacts. This can be done by using a ferromagnetic contact with a higher coercivity than the other ferromagnetic contacts, so that its magnetization direction is fixed during normal use. Alternatively, it is possible to exchange-bias the ferromagnetic contact with the fixed magnetization direction using an adjacent anti-ferromagnetic layer.

In a preferred embodiment of the invention, the spintronic circuit is a memory circuit comprising several 1-bit memory cells each associated with one of the ferromagnetic contacts, wherein in each of the memory cells the magnetization direction of the ferromagnetic contact represents the binary state of the memory cell. Further, the memory circuit comprises an electric output measured by the measuring unit, wherein the output is a multi-level output so that a single measurement of the measuring unit represents the binary states of all memory cells of the memory circuit. For writing information into such a memory circuit, the magnetization directions of the individual ferromagnetic contacts have to be adjusted accordingly as described above. A read-out is simply made by measuring the afore-mentioned multi-level output.

In another embodiment of the invention, the spintronic circuit is a logic circuit performing a logic operation (e.g. NOR, AND). Therefore, the logic circuit comprises several inputs and one output, wherein the inputs and the output are preferably binary. The inputs of the logic circuit are each associated with the magnetization direction of one of the ferromagnetic contacts. The output of the logic circuit is associated with the multi-level output measured by the measuring unit, wherein one or more of the values of the multi-level output are associated with one binary value, while the other values of the multi-level output are associated with the other binary value.

In such a logic circuit, at least one of the ferromagnetic contacts can be used for defining the type of logic operation performed by the logic circuit. For example, the logic circuit performs an AND-operation if the programming input brings the magnetization direction of the corresponding ferromagnetic contact in a "down state". Alternatively, the logic circuit performs a NOR-operation, if the programming input brings the magnetization direction of the corresponding ferromagnetic contact in an "up state".

Further, it should be noted that the invention also encompasses a method of operation of such a spintronic circuit which needs no further explanation.

DETAILED DESCRIPTION OF THE DRAWINGS

Figure 1:
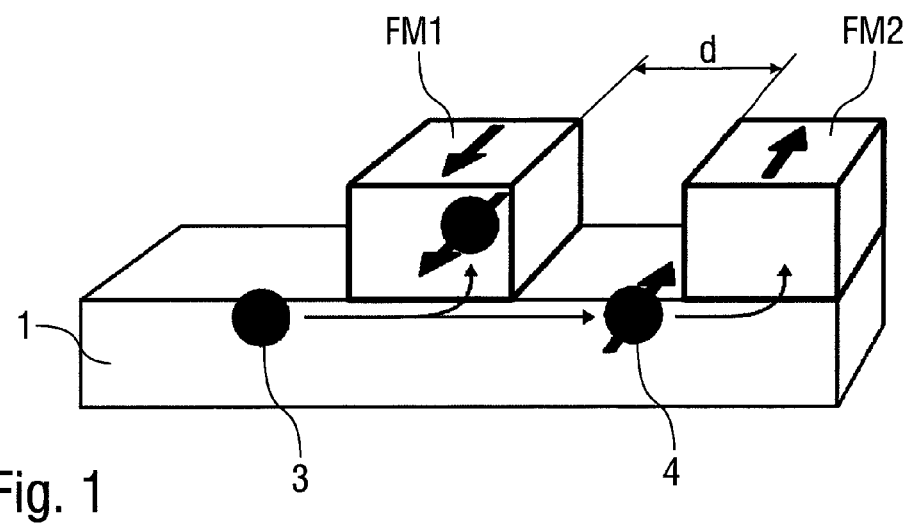
FIG. 1 shows a schematic perspective view of a spintronic building block comprising a non-magnetic channel and two ferromagnetic contacts.
Figure 2:
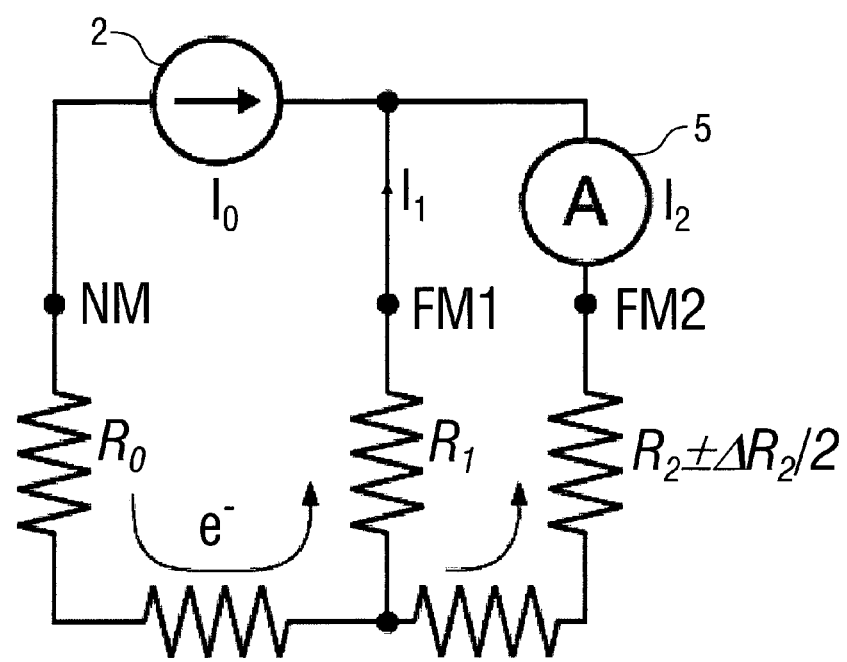
FIG. 2 shows an equivalent circuit of the spintronic circuit according to FIG. 1, wherein the equivalent circuit also shows a measuring unit and a current source.

FIGS. 1 and 2 illustrate a basic sample of a spintronic circuit according to the invention.

Firstly, the spintronic circuit comprises an electrically conductive, non-magnetic channel 1 which is made of, for example, n-type gallium arsenide, aluminium, or graphene.

Further, the spintronic circuit shown in FIGS. 1 and 2 comprises two ferromagnetic contacts FM1 and FM2, which are arranged on the top side of the non-magnetic channel 1 along the non-magnetic channel one after another.

Moreover, the spintronic circuit comprises a current source 2 (not shown in FIG. 1) for injecting an electron current e⁻ corresponding to an electric current $I_0$ to the non-magnetic channel 1 via a non-magnetic contact NM (not shown in FIG. 1) arranged on the non-magnetic channel 1. Therefore, the current source 2 injects unpolarized electrons 3 into the non-magnetic channel 1, wherein the unpolarized electrons 3 propagate along the non-magnetic channel 1 to the first ferromagnetic contact FM1 as shown by the arrows.

Both the ferromagnetic contact FM1 and the ferromagnetic contact FM2 are magnetized and comprise an adjustable magnetization direction as shown by the arrows. In the embodiment shown in FIG. 1, the ferromagnetic contacts FM1 and FM2 comprise opposite magnetization directions as shown by the arrows.

The unpolarized electrons 3 arriving at the ferromagnetic contact FM1 become polarized by spin reflection (spin extraction) at this contact, wherein the spin direction generated at the ferromagnetic contact FM1 by spin reflection (spin extraction) depends on the magnetization direction of the ferromagnetic contact FM1. Therefore, the ferromagnetic contact FM1 generates polarized electrons 4 comprising a specific spin direction as shown by the arrow.

The polarized electrons 4 propagate along the non-magnetic channel 1 from the ferromagnetic contact FM1 to the ferromagnetic contact FM2. It is essential for the invention that the polarization of the polarized electrons 4 does not substantially decay between the ferromagnetic contact FM1 and the ferromagnetic contact FM2. Therefore, there is a short distance d between the ferromagnetic contacts FM1, FM2, wherein the distance d is smaller than the spin diffusion length, so that the polarized electrons 4 arrive at the ferromagnetic contact FM2 still comprising a substantial polarization.

The non-magnetic contact NM comprises a contact resistance $R_0$, while the ferromagnetic contacts FM1 and FM2 comprise contact resistances $R_1$ and $R_2$, respectively. Therefore, the spintronic circuit shown in FIGS. 1 and 2 forms a current divider, wherein the electric current $I_0$ generated by the current source 2 splits into partial currents $I_1$ and $I_2$ through the ferromagnetic contacts FM1 and FM2, respectively. The values of the partial currents $I_1$ and $I_2$ depend on the contact resistances $R_1$ and $R_2$. The contact resistance $R_2$ is in turn determined by the magnetoresistance; namely, the contact resistance $R_2$ depends on the relative alignment of the spin direction of the polarized electrons 4 (determined by FM1) and the magnetization direction of the ferromagnetic contact FM2.

Further, the spintronic circuit comprises a measuring unit 5 which measures the partial current $I_2$ flowing through the ferromagnetic contact FM2. It should be noted that the partial current $I_2$ comprises two different output levels depending on the contact resistance of the ferromagnetic contact FM2. Therefore, a single measurement of the partial current $I_2$ by the measuring unit 5 is sufficient for determining the magnetization configuration of the entire spintronic circuit, wherein the magnetization configuration represents the magnetization directions of the ferromagnetic contacts FM1 and FM2. Note that symmetrically equivalent magnetic configurations (e.g. "up, up" and "down, down" are symmetrically equivalent, as are "up, down" and "down, up") cannot be distinguished in this example. A strategy for avoiding the occurrence of symmetrically equivalent configurations by fixing the magnetization direction of one ferromagnetic contact is described in the Description section.

Figure 3:
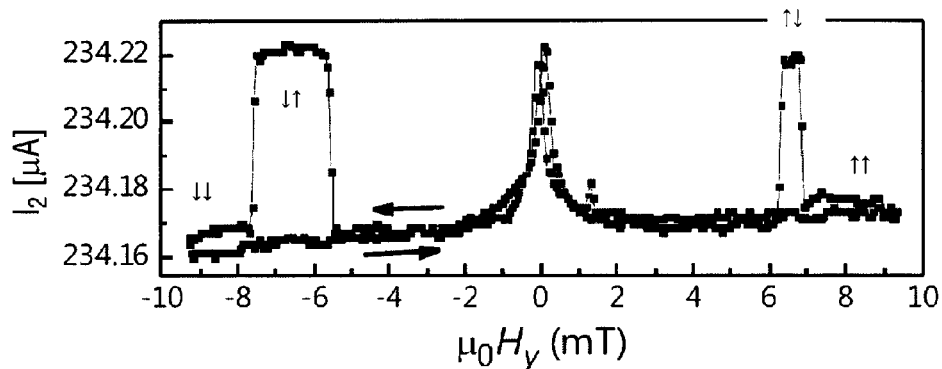
FIG. 3 shows the measured current in FIG. 2 upon sweeping of the magnetic field along the easy axis of the ferromagnetic contacts.

FIG. 3 is a measurement showing that the relative magnetizations of the ferromagnetic contacts FM1 and FM2 switch between parallel (low partial current $I_2$ through the ferromagnetic contact FM2) and anti-parallel (high partial current $I_2$ through the ferromagnetic contact FM2) upon sweeping the magnetic field along the easy axis of the ferromagnetic contacts FM1 and FM2.

Figure 4:
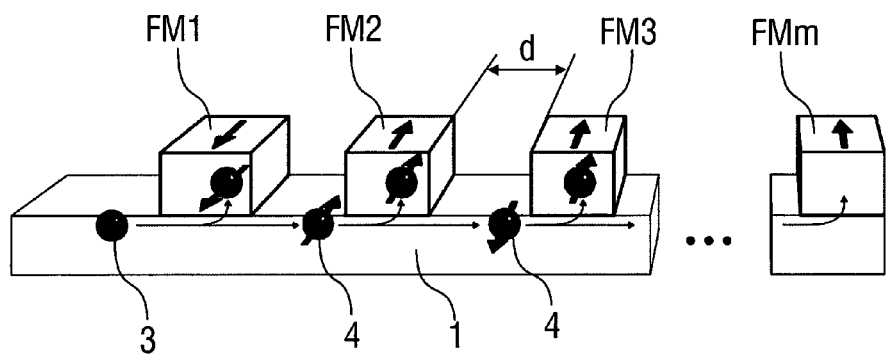
FIG. 4 shows a modification of FIG. 1 with m ferromagnetic contacts.

FIG. 4 shows a modification of the embodiment according to FIG. 1 comprising m ferromagnetic contacts FM1, FM2, FM3, . . . , FMm. However, the operating principles of this embodiment are identical to the operating principles of the embodiment according to FIG. 1 so that reference is made to the above description to avoid repetitions.

Figure 5:
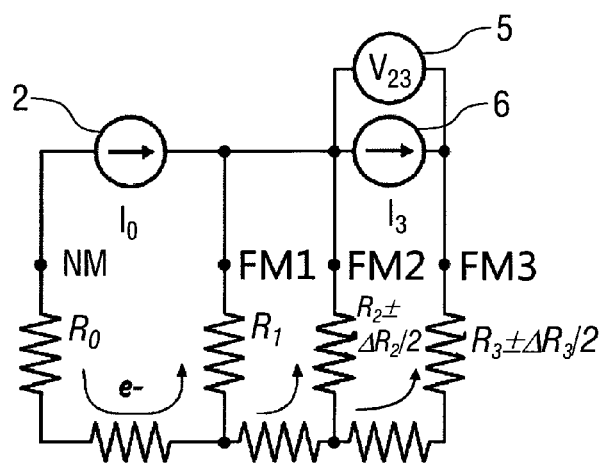
FIG. 5 shows an equivalent circuit of the spintronic circuit according to FIG. 4 with m=3 ferromagnetic contacts.

FIG. 5 shows an equivalent circuit of the embodiment according to FIG. 4 comprising m=3 ferromagnetic contacts FM1, FM2, and FM3.

Further, FIG. 5 shows a different type of the measuring unit 5, which is a voltmeter measuring a voltage drop $V_{23}$ between the ferromagnetic contacts FM2 and FM3. This type of measurement is made possible by an additional current source 6 parallel to the voltmeter between the ferromagnetic contacts FM2 and FM3. This type of a measurement using the additional current source 6 improves the signal-to-noise ratio of the measurement.

Figure 6:
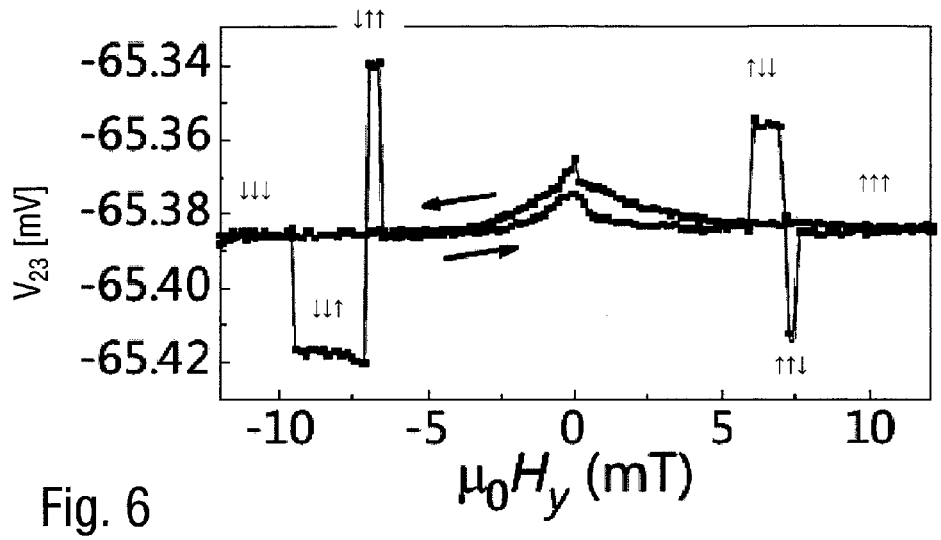
FIG. 6 shows a measurement of the circuit in FIG. 5 illustrating switching sequences upon sweeping the magnetic field.

FIG. 6 shows a measurement illustrating switching sequences upon sweeping a magnetic field in a double extraction experiment according to the circuit diagram of FIG. 5. The switching sequences yield an additional output state per field sweep in comparison to FIG. 3.

Figure 7:
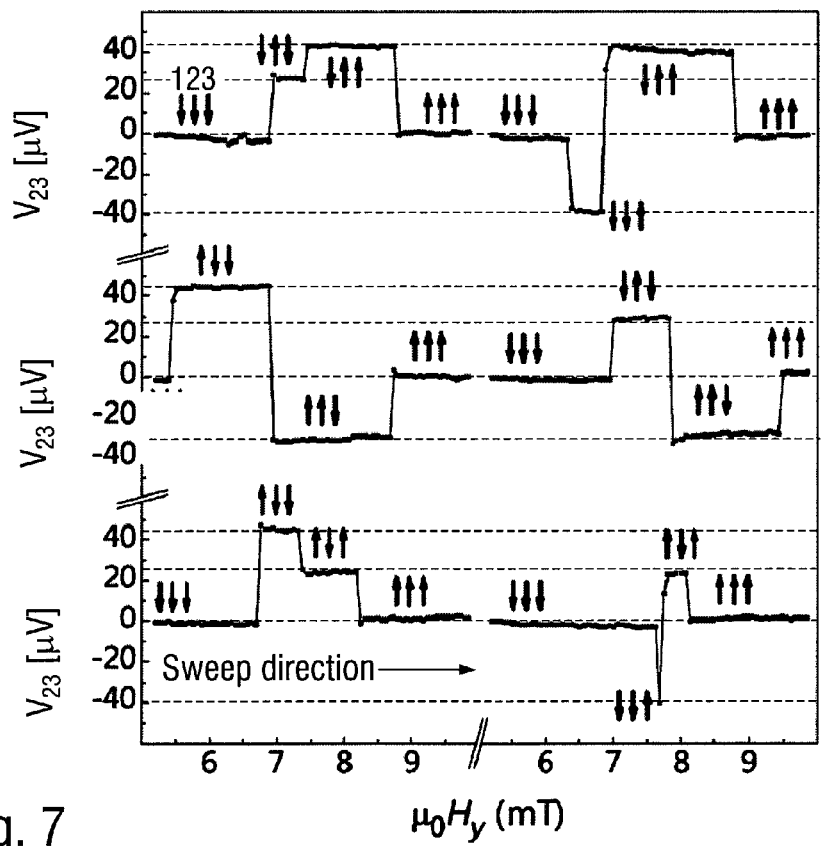
FIG. 7 shows a measurement illustrating the different possible magnetization configurations and the corresponding output levels.

FIG. 7 illustrates all six switching sequences in the double extraction experiment, where each are composed of three out of four different output levels. The four output levels (m=3, $2^{3-1}$=4) are shown in this diagram. The sequences reveal all eight possible magnetization configurations, as indicated by the arrows. The stochastic nature of the switching succession allows for the observation of all six sequences.

Figures 8, 9:
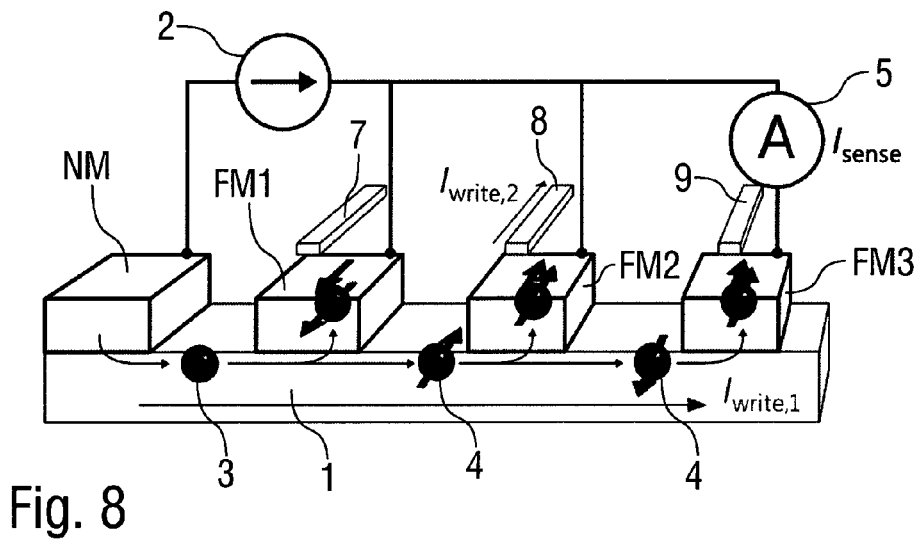
FIG. 8 shows a schematic perspective view of a memory circuit according to the invention.
FIG. 9 shows a logic table illustrating the operation of a logic circuit according to the invention.

FIG. 8 shows the definition of the magnetization directions of the ferromagnetic contacts FM1, FM2, and FM3 by current carrying conductors 7, 8, and 9 each generating a stray field acting on the associated ferromagnetic contact FM1, FM2, or FM3.

Figure 10:
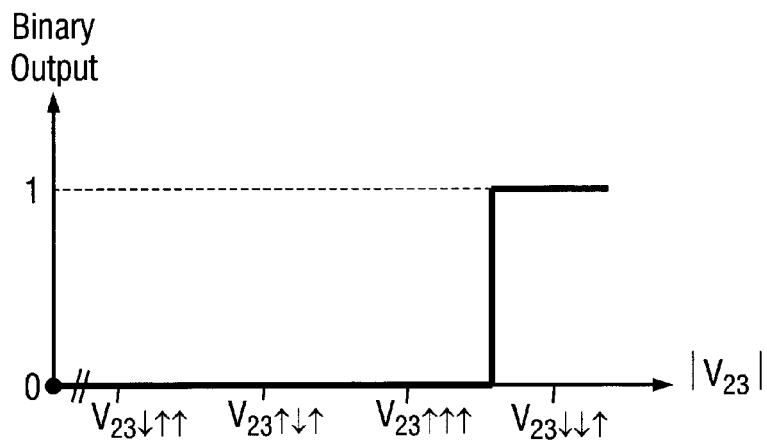
FIG. 10 shows a diagram illustrating the correspondence between the multi-level output and the binary output state.
Figure 11:
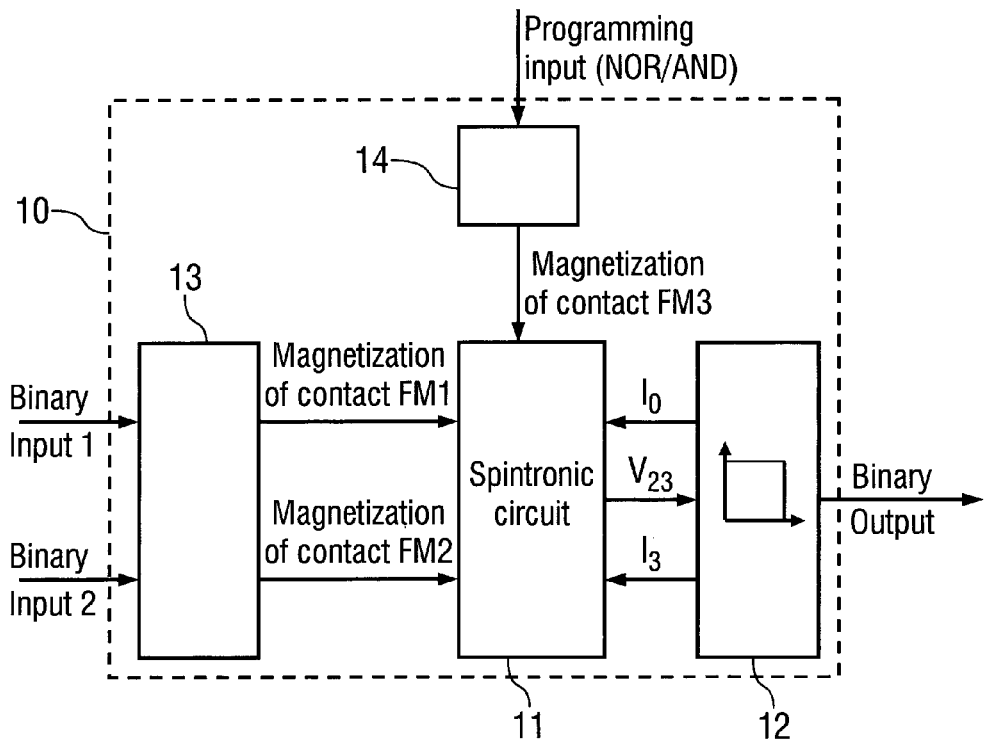
FIG. 11 is a schematic illustrating a logic circuit according to the invention.

FIG. 9 shows a logic table illustrating the use of the spintronic circuit according to the invention as a logic circuit 10 as shown in FIG. 11. The assignment of output levels to binary values is shown in FIG. 10.

FIG. 11 is a schematic illustrating a logic circuit according to the invention. Firstly, the logic circuit 10 contains a spintronic circuit 11 as illustrated, for example, in FIG. 8.

Further, the logic circuit 10 comprises a read-out circuit 12 measuring the voltage drop $V_{23}$ between the ferromagnetic contacts FM2 and FM3. Then, the read-out circuit 12 assigns a binary output to the voltage drop $V_{23}$ according, for example, to the characteristics shown in FIG. 10. In other words, the read-out circuit 12 associates one value of the voltage drop $V_{23}$ with a logic "1", while the other possible values of the voltage drop $V_{23}$ are associated with a logic "0".

Further, the logic circuit 10 comprises a write-in circuit 13 which receives two binary inputs and adjusts the magnetization directions of the ferromagnetic contacts FM1 and FM2 accordingly.

Further, the logic circuit 10 comprises a programming input to define the logic operation performed by the logic circuit 10. There are two possible logic operations, namely NOR or AND. Depending on the desired logic operation (NOR or AND), a programming circuit 14 adjusts the magnetization direction of the ferromagnetic contact FM3 accordingly.

Figure 12:
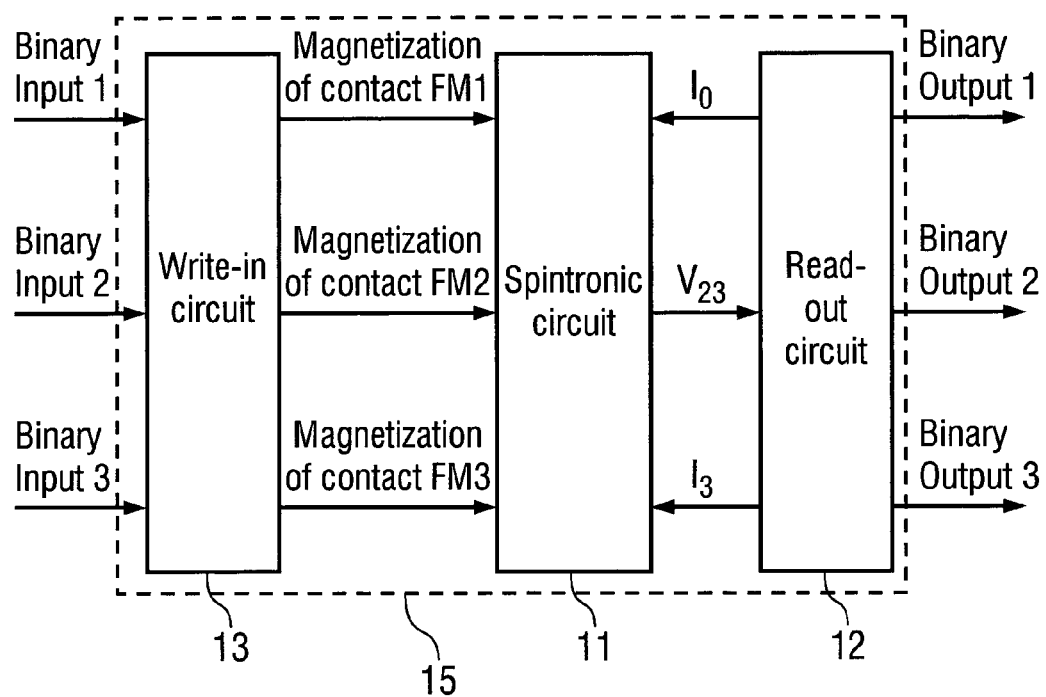
FIG. 12 is a schematic illustrating a memory circuit according to the invention.

Finally, FIG. 12 illustrates the use of the spintronic circuit 11 according to the invention in a memory circuit 15.

The memory circuit 15 also comprises a write-in circuit 13 and a read-out circuit 12 similar to the logic circuit 10 shown in FIG. 11.

The write-in circuit 13 adjusts the magnetization directions of the ferromagnetic contacts FM1, FM2, . . . , FMm depending on its binary inputs.

The read-out circuit 12 determines the magnetization configuration of the ferromagnetic contacts FM1, FM2, and FM3 from the voltage drop $V_{23}$ between the ferromagnetic contacts FM2 and FM3.

A variety of modifications and alternatives of the invention are possible without departing from the scope of protection as defined in the claims. Further, it should be noted that the application also claims protection for the subject-matter and the features of the dependent claims without the features of the preceding claims.

LIST OF REFERENCE SIGNS $e^-$ Electron current
$I_0$ Electric current through non-magnetic contact NM
$I_1$ Partial current through ferromagnetic contact FM1
$I_2$ Partial current through ferromagnetic contact FM2
$I_3$ Partial current through ferromagnetic contact FM3
NM Non-magnetic contact
FM1 Ferromagnetic contact
FM2 Ferromagnetic contact
FM3 Ferromagnetic contact
FM4 Ferromagnetic contact
FMm Ferromagnetic contact
Distance between the ferromagnetic contacts
$R_0$ Contact resistance of non-magnetic contact
$R_1$ Contact resistance of ferromagnetic contact FM1
$R_2$ Contact resistance of ferromagnetic contact FM2
$R_3$ Contact resistance of ferromagnetic contact FM3
1 Non-magnetic channel
2 Current source
3 Unpolarized electrons
4 Polarized electrons
5 Measuring unit
6 Current source
7 Current carrying conductor
8 Current carrying conductor
9 Current carrying conductor
10 Logic circuit
11 Spintronic circuit
12 Read-out circuit
13 Write-in circuit
14 Programming unit
15 Memory circuit

The invention claimed is:

1. Spintronic circuit comprising:
   a) a conductive non-magnetic channel,
   b) means for generating spin polarized electrons in the non-magnetic channel, and
   c) at least two ferromagnetic contacts arranged on the non-magnetic channel, wherein the ferromagnetic contacts each have an adjustable magnetization direction and a variable contact resistance, and
   d) means for adjusting the magnetization direction of the ferromagnetic contacts,
   e) wherein the ferromagnetic contacts are arranged on the non-magnetic channel along the non-magnetic channel one after another, and
   f) the means for generating the spin polarized electrons operate by spin extraction upon a net electron flow from the non-magnetic channel to one of the ferromagnetic contacts, and
   g) the spintronic circuit comprises a means for propagating the spin polarized electrons by way of drift along the non-magnetic channel caused by an applied electric field, and
   h) the spintronic circuit comprises means for measuring the contact resistances of the individual ferromagnetic contacts, wherein the contact resistances depend on the relative alignment of the spin polarization direction of the spin polarized electrons in the non-magnetic channel at the ferromagnetic contact on the one hand and the magnetization direction of the ferromagnetic contact on the other hand.

2. Spintronic circuit according to claim 1, wherein the means for generating the spin polarized electrons in the non-magnetic channel comprise:
   a) a non-magnetic contact arranged on the non-magnetic channel, and
   b) a first current source connected to the non-magnetic contact on the non-magnetic channel for injecting electrons into the non-magnetic channel, and
   c) spin extraction upon electron flow into a ferromagnetic contact.

3. Spintronic circuit according to claim 2, wherein a) the non-magnetic channel has a characteristic spin diffusion length, so that the spin polarization of the spin polarized electrons substantially decays after diffusion over the spin diffusion length, and b) there is a specific separation between the adjacent ferromagnetic contacts on the non-magnetic channel, wherein said separation is smaller than the spin diffusion length, so that the electron spin polarization does not substantially decay during propagation from one of the ferromagnetic contacts to the next one of the ferromagnetic contacts.

4. Spintronic circuit according to claim 1, wherein the spin polarization direction of the spin polarized electrons in the non-magnetic channel arriving at each ferromagnetic contact is determined by the spin extraction at the preceding ferromagnetic contacts along the channel.

5. Spintronic circuit according to claim 1, wherein the means for adjusting the magnetization direction of the ferromagnetic contacts comprise a current carrying conductor generating a stray field.

6. Spintronic circuit according to claim 1, wherein the magnetization direction of one of the ferromagnetic contacts is fixed in order to achieve a unique electric output for each of the magnetization configurations.

7. Spintronic circuit according to claim 6, wherein the ferromagnetic contact with the fixed magnetization direction has a higher coercivity than the other ferromagnetic contacts.

8. Spintronic circuit according to claim 6, wherein the ferromagnetic contact with the fixed magnetization direction is exchange-biased using an adjacent anti-ferromagnetic layer.

9. Spintronic circuit according to claim 1, wherein
   a) the spintronic circuit is a memory circuit comprising several 1-Bit memory cells each associated with one of the ferromagnetic contacts, wherein in each of the memory cells the magnetization direction of the ferromagnetic contact represents the binary state of the memory cell, and
   b) the electric output measured by the measuring unit is a multi-level output, so that a single measurement by the measuring unit represents the binary states of all memory cells of the memory circuit.

10. Spintronic circuit according to claim 1, wherein
    a) the spintronic circuit is a logic circuit performing a logic operation, wherein the logic circuit comprises several inputs and one output, and
    b) the output of the logic circuit is associated with the electric multi-level output measured by the measuring unit, and
    c) the inputs are each associated with the magnetization direction of one of the ferromagnetic contacts.

11. Spintronic circuit according to claim 10, wherein
    a) the inputs and the output of the logic circuit are binary, and
    b) one or more of the values of the multi-level output are associated to one binary value, while the other values of the multi-level output are associated to the other binary value.

12. Spintronic circuit according to claim 10, wherein at least one of the ferromagnetic contacts is a programming input, so that the magnetization direction of said programming input defines the type of the logic operation performed by the logic circuit.

13. Spintronic circuit according to claim 1, wherein the means for adjusting the magnetization direction of the ferromagnetic contacts comprise a spin-transfer torque mechanism.

14. Spintronic circuit according to claim 1, wherein the spintronic circuit is a memory circuit.

15. Spintronic circuit according to claim 1, wherein the spintronic circuit is a logic circuit.

16. Method of operation of a spintronic circuit comprising a non-magnetic channel and at least two ferromagnetic contacts arranged on the non-magnetic channel, wherein the method comprises the following steps:
    a) adjusting the magnetization direction of the ferromagnetic contacts,
    b) generating spin polarized electrons in the non-magnetic channel by spin extraction upon a net electron flow from the non-magnetic channel to the ferromagnetic contacts,
    c) propagation of the spin polarized electrons along the non-magnetic channel by an electric field, and
    d) measuring a contact resistance of at least one of the ferromagnetic contacts, wherein the contact resistance depends on the relative alignment of the spin polarization direction of the spin polarized electrons in the non-magnetic channel at the ferromagnetic contact on the one hand and the magnetization direction of the ferromagnetic contact on the other hand.

17. Spintronic circuit comprising:
    a) a conductive non-magnetic channel,
    b) means for generating spin polarized electrons in the non-magnetic channel, and c) at least two ferromagnetic contacts arranged on the non-magnetic channel, wherein the ferromagnetic contacts each have an adjustable magnetization direction and a variable contact resistance, and
d) means for adjusting the magnetization direction of the ferromagnetic contacts,
e) wherein the ferromagnetic contacts are arranged on the non-magnetic channel along the non-magnetic channel one after another, and
f) the means for generating the spin polarized electrons operate by spin extraction upon a net electron flow from the non-magnetic channel to one of the ferromagnetic contacts, and
g) the spintronic circuit comprises a means for propagating the spin polarized electrons by way of drift along the non-magnetic channel caused by an applied electric field, and
h) the spintronic circuit comprises means for measuring the contact resistances of the individual ferromagnetic contacts, wherein the contact resistances depend on the relative alignment of the spin polarization direction of the spin polarized electrons in the non-magnetic channel at the ferromagnetic contact on the one hand and the magnetization direction of the ferromagnetic contact on the other hand, wherein
i) the non-magnetic channel has a characteristic spin diffusion length, so that spin polarization of the spin polarized electrons substantially decays after diffusion over the spin diffusion length, and
j) there is a specific separation between adjacent ferromagnetic contacts on the non-magnetic channel, wherein said separation is smaller than the spin diffusion length, so that the electron spin polarization does not substantially decay during propagation from one of the ferromagnetic contacts to the next one of the ferromagnetic contacts.

18. Spintronic circuit comprising:
a) a conductive non-magnetic channel,
b) means for generating spin polarized electrons in the non-magnetic channel, and
c) at least two ferromagnetic contacts arranged on the non-magnetic channel, wherein the ferromagnetic contacts each have an adjustable magnetization direction and a variable contact resistance, and
d) means for adjusting the magnetization direction of the ferromagnetic contacts,
e) wherein the ferromagnetic contacts are arranged on the non-magnetic channel along the non-magnetic channel one after another, and
f) the means for generating the spin polarized electrons operate by spin extraction upon a net electron flow from the non-magnetic channel to one of the ferromagnetic contacts, and
g) the spintronic circuit comprises a means for propagating the spin polarized electrons by way of drift along the non-magnetic channel caused by an applied electric field, and
h) the spintronic circuit comprises means for measuring the contact resistances of the individual ferromagnetic contacts, wherein the contact resistances depend on the relative alignment of the spin polarization direction of the spin polarized electrons in the non-magnetic channel at the ferromagnetic contact on the one hand and the magnetization direction of the ferromagnetic contact on the other hand,
wherein the means for generating the spin polarized electrons in the non-magnetic channel comprise:
a) a non-magnetic contact arranged on the non-magnetic channel, and
b) a first current source connected to the non-magnetic contact on the non-magnetic channel for injecting electrons into the non-magnetic channel, and
c) spin extraction upon electron flow into a ferromagnetic contact, and wherein
a) the ferromagnetic contacts are connected to the first current source, so that the electron current generated by the first current source flows through the non-magnetic contact into the non-magnetic channel and splits into partial electron currents flowing through the ferromagnetic contacts back to the first current source, wherein the partial currents depend on the contact resistances of the individual ferromagnetic contacts, and
b) an electric output is measured by a measuring unit at one or more of the ferromagnetic contacts.

19. Spintronic circuit according to claim 18, wherein the measuring unit measures the partial current flowing through one of the ferromagnetic contacts.

20. Spintronic circuit according to claim 18, wherein
a) the measuring unit measures a voltage drop between two of the ferromagnetic contacts, and
b) there is a second current source connected in parallel to the measuring unit between the ferromagnetic contacts thereby improving the signal-to-noise ratio of the measurement.

21. Spintronic circuit according to claim 18, wherein
a) the magnetization directions of the ferromagnetic contacts together represent a magnetization configuration of the spintronic circuit, and
b) the electric output measured by the measuring unit is a multi-level output comprising several possible output levels, and
c) each magnetization configuration of the spintronic circuit is associated with one of the output levels of the multi-level output, so that a single measurement by the measuring unit represents the complete magnetization configuration of the spintronic circuit.

* * * * *